(12) United States Patent
White et al.

(10) Patent No.: US 6,483,318 B1
(45) Date of Patent: Nov. 19, 2002

(54) ELECTRIC CIRCUIT PROVIDING SELECTABLE SHORT CIRCUIT FOR INSTRUMENTATION APPLICATIONS

(75) Inventors: Charles Michael White, Escondido, CA (US); Barry James Smith, Oceanside, CA (US)

(73) Assignee: Ideal Industries, Inc., Sycamore, IL (US)

( * ) Notice: Subject to any disclaimer, the term of this patent is extended or adjusted under 35 U.S.C. 154(b) by 0 days.

(21) Appl. No.: 09/896,421

(22) Filed: Jun. 29, 2001

(51) Int. Cl.[7] ............................................... H01H 31/02
(52) U.S. Cl. ...................................................... 324/539
(58) Field of Search ................................. 324/754, 755, 324/158.1, 539; 361/79

(56) References Cited

U.S. PATENT DOCUMENTS 4,542,302 A * 9/1985 Griffioen .................... 307/326
6,051,968 A * 4/2000 Shim et al. ............... 324/158.1

* cited by examiner

*Primary Examiner*—N. Le
*Assistant Examiner*—Etienne P LeRoux
(74) *Attorney, Agent, or Firm*—Cook, Alex, McFarron, Manzo, Cummings & Mehler, Ltd.

(57) ABSTRACT

A LAN cable tester circuit is disclosed having measurement end circuit components and shorting end circuit components. The measurement end circuit components are conventional and include a multiplexer having a current source and voltage sensing circuitry electrically coupled thereto. The multiplexer also has a plurality of pairs of associated electrical conductors included in the cable under test coupled thereto. The shorting end circuit components include another multiplexer having the opposite ends of the electrical conductors coupled thereto, and further having a differential voltage amplifier and two current output differential amplifiers electrically coupled thereto. The shorting end circuit components provide for an active short that eliminates the effect of the on-resistance attributable to semiconductor integrated circuit multiplexers.

45 Claims, 5 Drawing Sheets

Fig. 1 *Prior Art*

ELECTRIC CIRCUIT PROVIDING SELECTABLE SHORT CIRCUIT FOR INSTRUMENTATION APPLICATIONS

BACKGROUND OF THE INVENTION

The present invention relates generally to an electric circuit used in instrumentation applications, and more particularly, an electronic circuit providing a selectable short circuit for use in instrumentation applications such as measuring the total resistance of pairs of associated electrical conductors in transmission lines having a plurality of conductor pairs.

Use of electronic circuits in instrumentation applications is well known. Included among such applications is the measurement of the total resistance for a pair of associated electrical conductors included within a transmission line having a plurality of associated electrical conductor pairs. One such transmission line is a cable having a plurality of associated electrical conductor pairs. Those skilled in the art will appreciate that a multi-pair cable tester such as a local area network (LAN) cable tester is generally utilized to measure the wire pair resistance as part of the testing conducted in order to ensure that the cable functions properly in accordance with its required specifications. The wire pair resistance test is performed for each pair of associated electrical conductors included within the tested cable. This test is carried out one pair at a time. Alternatively, one select pair of associated electrical conductors will constitute a cable tester or certifier pair, and will be the pair of conductors subject to testing.

In order to perform the wire pair resistance test, for each electrical conductor pair, the adjacent ends positioned at one end of the transmission line (i.e., shorting end) are selectively electrically coupled together by a short circuit provided between those ends. For the pair under test, a current source is selectively electrically coupled to its opposite end positioned at the other end of the transmission line (i.e., measurement end). As such, the current source selectively drives an electrical current through that electrical conductor of the pair, through the selectable short electrically coupling the conductors, and through the other electrical conductor of the pair. The measurement end of the other conductor of the pair is selectively electrically coupled to a specified reference voltage or return path, thereby completing a circuit path for the electrical current driven through the associated conductors of the pair by the current source.

At the measurement end, voltage sensing circuitry is selectively electrically coupled across the associated electrical conductors of the pair. The differential voltage of the conductors is measured by the voltage sensing circuitry, indicating the voltage drop across the electrical conductors and the selectable short circuit. From the measured voltage and the test current, the total resistance for the electrical conductors can be determined. In effect, this value can be determined by dividing the magnitude of the sensed voltage by the known magnitude of the electrical current produced by the current source. This calculation is well known by those skilled in the art as an application of Ohm's law.

When pairs of associated electrical conductors in transmission lines are tested, several different tests are conducted on each conductor pair. As a result, and as those skilled in the art will appreciate, it is impractical to electrically couple the shorting ends of each conductor in the pair with a simple short. In addition to total resistance, other parameters are also measured, such as capacitance, electrical length, and radio frequency (RF) response parameters. Multiplexer circuitry is generally electrically coupled at each end of the electrical conductors in the transmission line to permit the selected pair of associated conductors to be electrically coupled to the measurement and/or shorting circuits for the variety of measurements to be taken during testing.

FIG. 1 illustrates a prior art cable conductor pair resistance test circuit generally designated 10. Test circuit 10 is designed to permit determination of the total resistance for selected pairs of the electrical conductors included within a transmission line such as cable 12 shown in FIG. 1 by providing a selectable short between the conductor pairs being measured. In its illustrated form, cable 12 includes a first pair of associated electrical conductors 14, 16, a second pair of associated electrical conductors 18, 20, a third pair of associated electrical conductors 22, 24, and a fourth pair of associated electrical conductors 26, 28.

Test circuit 10 includes measurement circuit components grouped together and identified by reference numeral 30 positioned at the measurement end of the test circuit, and shorting circuit components grouped together and identified by reference numeral 32 positioned at the shorting end of the test circuit. In the illustrated form, measurement circuit components 30 include a multiplexer circuit 34 shown in the form of a four-wire differential four-to-one multiplexer. Multiplexer circuit 34 includes a plurality of terminals such as pins incorporated in an integrated circuit packaging. Among the terminals of multiplexer circuit 34, for present purposes, select ones of those terminals are designated DRV+, DRV−, SEN+, SEN−, A+, A−, B+, B−, C+, C−, D+, and D−.

Measurement circuit components 30 also include a current source 36, a differential voltage sensing amplifier 38, and the combination of a series-coupled resistor 40 and voltage source 42, all of which are electrically coupled to multiplexer circuit 34. In particular, current source 36 is electrically coupled at one of its ends to the DRV+ terminal of multiplexer circuit 34, and at its other end to a voltage reference, as shown. The input terminals of differential amplifier 38 are electrically coupled to the SEN+ and SEN− terminals of multiplexer circuit 34, while its output terminal is preferably electrically coupled to additional voltage sensing circuitry (not shown). The combination of resistor 40 and voltage source 42 is electrically coupled to the DRV− terminal of multiplexer circuit 34 at one of its ends, and electrically coupled to a voltage reference at its other end.

As further shown, with respect to the electrical conductors included within cable 12, conductor 14 is electrically coupled to terminal A+ of multiplexer circuit 34, conductor 16 is electrically coupled to terminal A− of multiplexer circuit 34, and so forth, as shown. With this arrangement, determination of the total resistance for pairs of associated electrical conductors of cable 12 can be measured by measurement circuit 30.

Shorting circuit components 32 include a multiplexer circuit 44 illustrated as a differential four-to-one multiplexer. Similar to multiplexer circuit 34, multiplexer circuit 44 includes a plurality of terminals such as pins of the type used in integrated circuit packaging technology. Among the terminals of multiplexer circuit 44, for present purposes, select ones have been designated A+, A−, B+, B−, C+, C−, D+, D−, SEN+, and SEN−.

Shorting circuit 32 also includes a relay or semiconductor switch 46 having two terminals. One terminal of relay/switch 46 is electrically coupled to the SEN+ terminal of multiplexer 44, while the other terminal of relay/switch 46 is electrically coupled to the SEN− terminal of multiplexer circuit 44.

With respect to the electrical conductors included within cable 12, their respective shorting ends to be electrically coupled by a short circuit due to relay/switch 46 during the test are electrically coupled to select ones of the terminals for multiplexer circuit 44. In particular, electrical conductor 14 is electrically coupled to terminal A+ of multiplexer circuit 44, electrical conductor 16 is electrically coupled to terminal A− multiplexer circuit 44, and so forth, as shown.

With this arrangement, as will be appreciated by those skilled in the art, shorting circuit 32 is able to selectively provide a short circuit between associated electrical conductors included within cable 12.

In operation, measurement circuit 30 permits determination of the total resistance for two associated electrical conductors of a select pair within cable 12 when shorting circuit 32 provides a short circuit at the opposite end of the conductors under test. In particular, when it is desired to determine the total resistance for a select pair of associated conductors, the channel of multiplexer circuit 34 electrically coupled to that pair is enabled, thereby electrically coupling current source 36 and the noninverting input terminal of differential amplifier 38 to one of the associated electrical conductors of the select pair at its measurement end, while electrically coupling the inverting input terminal of differential amplifier 38 and the combination of resistor 40 and voltage source 42 to the measurement end of the other associated electrical conductor in the select pair.

At that same time, the corresponding channel of multiplexer circuit 44 is enabled such that one of the associated conductors in the select pair is electrically coupled to one terminal of relay/switch 46, while the other electrical conductor in the select pair is electrically coupled to the other terminal of relay/switch 46. Relay/switch 46 is then closed, allowing the predetermined current to be delivered by current source 36 through the formed circuit path. In particular, this current is driven through the selected channel of multiplexer circuit 34, through the first electrical conductor of the selected pair, through the selected channel of multiplexer circuit 44, through relay 46, back through multiplexer circuit 44, through the other electrical conductor of the selected pair, back through multiplexer circuit 34, and through resistor 40.

The known current delivered by current source 36 will create a voltage differential between the respective measurement ends of the two associated electrical conductors of the selected pair. This differential voltage is related directly to the total wire resistance of those two electrical conductors. This differential voltage is measured by the differential voltage sensing amplifier 38 and any associated circuitry (not shown) electrically coupled to its output terminal. It will be appreciated that from this measured voltage, the total resistance of the associated electrical conductors in the selected pair can be determined therefrom in accordance with Ohm's law, or in any other manner generally available.

FIG. 2 illustrates a schematic representation of the four-wire differential four-to-one multiplexer circuit 34 shown in FIG. 1. As shown, multiplexer circuit 34 includes a first four-to-one multiplexer circuit 50 designated M_D−, a second four-to-one multiplexer circuit 52 designated M_S−, a third four-to-one multiplexer circuit 54 designated M S+, and a fourth four-to-one multiplexer circuit 56 designated M_D+. As shown, multiplexer circuits 50, 52, 54, 56 are each electrically coupled to one of terminals DRV+, DRV−, SEN+, and SEN− of multiplexer circuit 34. Furthermore, multiplexer circuits 50,52,54,56 are each electrically coupled to one of the associated electrical conductors in each pair of conductors included within cable 12 (see FIG. 1) through select terminals of multiplexer circuit 34.

For example, multiplexer circuit 50 is electrically coupled to the DRV− terminal of multiplexer circuit 34, and is further electrically coupled to terminals A−, B−, C− and D− of multiplexer circuit 34, which, in turn, are electrically coupled to respective ones of the associated electrical conductors in each pair undergoing the total resistance wire pair test. It will be appreciated by those skilled in the art that the configuration of multiplexer circuit 34 shown in FIG. 2, as applied to the circuit shown in FIG. 1, is such that its on-resistance is effectively eliminated from having any effect on the test.

Referring back to FIG. 1, as described above, when the total resistance for a selected pair of associated electrical conductors is determined, multiplexer circuit 34 at the measurement end selects that pair, multiplexer circuit 44 at the shorting end also selects that pair, and relay or semiconductor switch 46 is closed. Current is then driven through the circuit by current source 36, and the voltage differential at the respective measurement ends of the associated electrical conductors is measured, thereby allowing the total resistance of the conductive path between those two measurement ends of the associated electrical conductors to be determined.

It will be appreciated by those skilled in the art that a resistance measurement error contribution results from the on-resistance of multiplexer circuit 44 and relay/switch 46. For example, in the case where the first pair of associated electrical conductors 14, 16 is undergoing the wire pair resistance test, the total resistance calculated would equal the sum of the resistance seen along the entire circuit path between the measurement end E20 of conductor 14 and the measurement end E21 of conductor 16. This total resistance would not only include the round-trip conductor resistance of conductors 14, 16, as desired, but would also include the round-trip resistance through multiplexer circuit 44 and relay/switch 46, which is not desired.

Prior art applications have attempted to negate and/or minimize the effect of the on-resistance associated with multiplexer circuit 44 and relay/switch 46. One approach implemented in prior art applications is the use of an electromechanical relay multiplexer having inherently low on-resistance characteristics. Those skilled in the art will appreciate that this approach has significant limitations, however, because electromechanical relays are inherently relatively large, slow, and less reliable in operation than their counterpart semiconductor integrated circuit multiplexers. As a result, this approach has proved to have significant shortcomings.

Another approach implemented in prior art applications is the development of systems and methods that mathematically calibrate out the contribution of the multiplexer and relay/switch on-resistance. While this approach is suitable for certain, limited applications, it is not suited for those circumstances in which the multiplexer and relay/switch on-resistance varies between the time the system was calibrated and the time the test is conducted. This error can be significant, as the typical semiconductor multiplexer on-resistance is in the range of one hundred ohms per leg (i.e., twice that for the round-trip multiplexer on-resistance). Furthermore, the on-resistance for the typical semiconductor multiplexer varies significantly with temperature. As a result, achieving a total resistance measurement or calculation with a resolution of one ohm or less is quite difficult under prior art practices.

In view of the foregoing, it is desirable to develop a new and improved electronic circuit used in instrumentation applications.

It is further desirable to develop a new and improved electronic circuit providing a selectable short circuit for use in instrumentation applications.

It is further desirable to develop a new and improved electric circuit that permits determination of the total resistance of pairs of associated electrical conductors in transmission lines having a plurality of conductor pairs.

It is further desirable to develop a new and improved LAN cable tester circuit.

It is further desirable to develop a new and improved LAN cable tester circuit that determines the total resistance of a pair of associated electrical conductors corresponding to a LAN cable tester or certifier.

It is further desirable to develop an electric circuit that negates the effect of the multiplexer on-resistance at the shorting end in cable wire pair test circuits.

It is further desirable to develop an electric circuit that negates the effect of the relay or switch used to short the shorting ends of two associated electrical conductors.

It is further desirable to develop an electric circuit having active electronic circuit components that emulate a short circuit.

It is further desirable to develop an electric circuit in which the active short circuit inherently cancels the on-resistance attributable to a semiconductor integrated circuit multiplexer electrically coupled thereto.

It is further desirable to develop an electric circuit that allows for use of semiconductor integrated circuit multiplexer circuits.

It is further desirable to develop an electric circuit that allows for use of smaller circuit components than used by counterpart circuits in certain instrumentation applications.

It is further desirable to develop an electric circuit that allows for use of less expensive circuit components than used by counterpart circuits in certain instrumentation applications.

It is further desirable to develop an electric circuit that dissipates less power than other counterpart circuits used in certain instrumentation applications.

It is further desirable to develop an electric circuit that is highly reliable.

It is further desirable to develop an electric circuit that permits elimination of a bank of electromechanical relays in certain instrumentation applications.

It is further desirable to develop an electronic circuit for use in instrumentation applications that require a precision short circuit to be applied to various pairs of associated electrical conductors or contacts.

These and other desired benefits of the preferred forms of the intention will become apparent from the following description. It will be understood, however, that a system or method could still appropriate the claimed invention without accomplishing each and every one of these desired benefits, including those gleaned from the following description. The appended claims, not these desired benefits, define the subject matter of the invention. Any and all benefits are derived from the preferred forms of the invention, not necessarily the invention in general.

BRIEF SUMMARY OF THE INVENTION

In a preferred aspect of the invention, the invention is directed to a circuit for providing a selectable short between a pair of electrical nodes selected from a plurality of pairs of electrical nodes. The circuit includes a multiplexer circuit, a differential voltage amplifier circuit and first and second current output differential amplifier circuits.

The multiplexer circuit has a first terminal electrically coupled to a first node of a first pair of nodes. A second terminal is electrically coupled to a second node of the first pair of nodes. A third terminal is electrically coupled to a first node of a second pair of nodes. A fourth terminal is electrically coupled to a second node of the second pair of nodes. The multiplexer also includes at least four other terminals.

The differential voltage amplifier circuit has a first input terminal electrically coupled to a fifth terminal of the multiplexer circuit. It also has a second input terminal electrically coupled to a sixth terminal of the multiplexer circuit. Further, it has an output terminal.

The first current output differential amplifier circuit has a first input terminal electrically coupled to the output terminal of the differential voltage amplifier circuit. It also has a second input terminal held at a predetermined voltage level. Further, it has an output terminal electrically coupled to a seventh terminal of the multiplexer circuit.

The second current output differential amplifier circuit has a first input terminal electrically coupled to the output terminal of the differential voltage amplifier circuit. It also has a second input terminal held at a predetermined voltage level. Further, it has an output terminal electrically coupled to an eighth terminal of the multiplexer circuit.

In a first condition, the multiplexer circuit electrically couples its first terminal to its fifth terminal and to its seventh terminal. At that same time, it also electrically couples its second terminal to its sixth terminal and to its eighth terminal.

In a second condition, the multiplexer circuit electrically couples its third terminal to its fifth terminal and to its seventh terminal. At that same time, it also electrically couples its fourth terminal to its sixth terminal and to its said eighth terminal.

BRIEF DESCRIPTION OF THE SEVERAL VIEWS OF THE DRAWING

Throughout this description, reference has been and will be made to the accompanying views of the drawing wherein like subject matter has like reference numerals, and wherein.

DETAILED DESCRIPTION OF THE INVENTION

Figure 3:
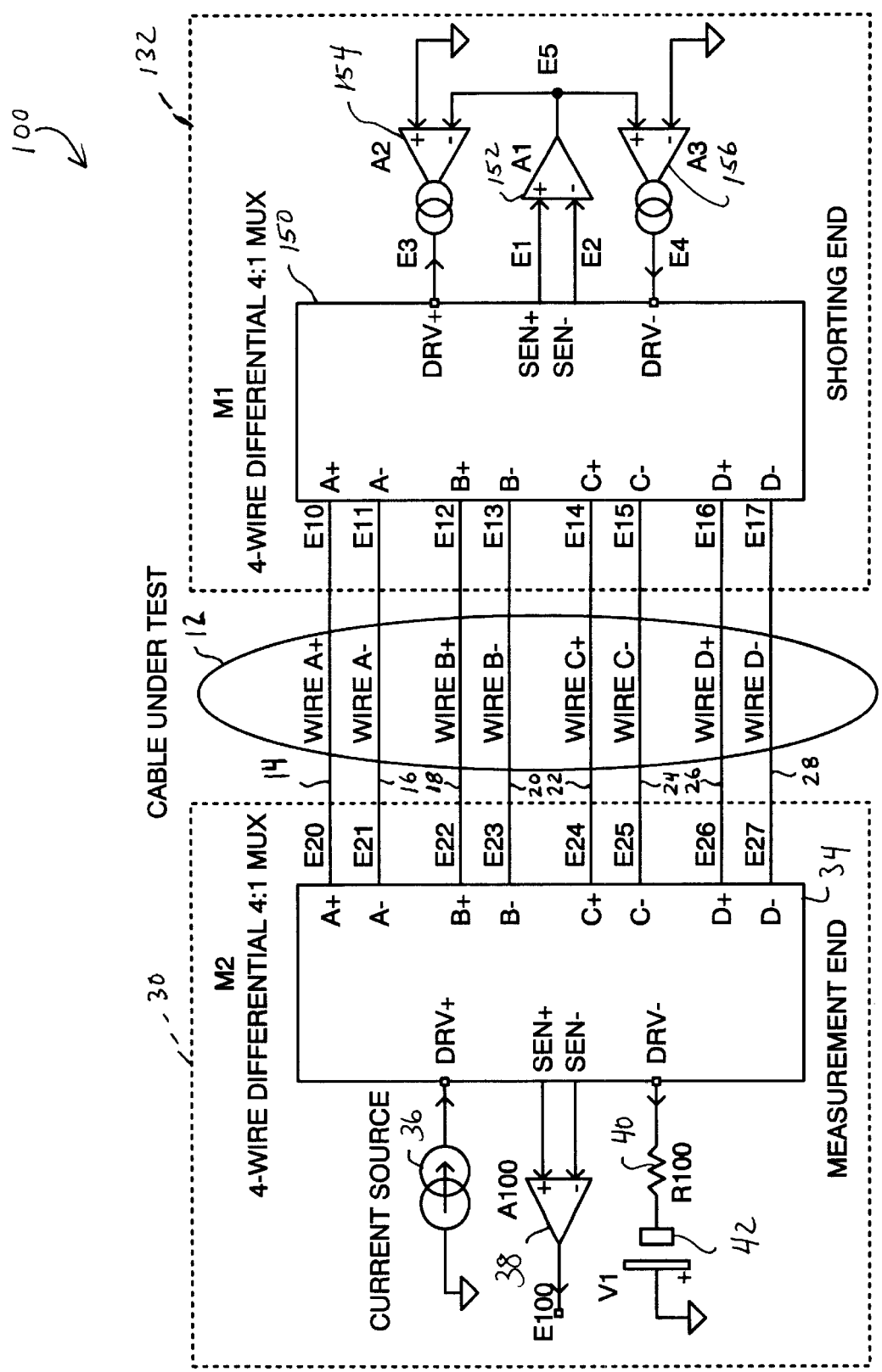
FIG. 3 is a circuit schematic diagram of the circuit components included within a conductor pair resistance test circuit constructed in accordance with the principles of the present invention.

FIG. 3 illustrates a cable conductor pair resistance test circuit generally designated 100 and having circuit components and modules designed in accordance with the principles of the present invention. Test circuit 100 is designed to permit the determination of the total resistance for selected pairs of the electrical conductors included within a transmission line such as cable 12. In its illustrated form, cable 12 includes a first pair of associated electrical conductors 14, 16, a second pair of associated electrical conductors 18, 20, a third pair of associated electrical conductors 22, 24, and a fourth pair of associated electrical conductors 26, 28. In this regard, cable 12 is identical to its configuration shown in FIG. 1.

Test circuit 100 includes measurement circuit components grouped together and identified by reference numeral 30 positioned at the measurement end of the test circuit, and also includes shorting circuit components grouped together and identified by reference numeral 132 positioned at the shorting end of the testing circuits. As should be apparent, measurement circuit components 30 are identical to their form in FIG. 1. On the other hand, shorting circuit components 132 differ from shorting circuit components 32 shown in FIG. 1. In particular, shorting circuit components 132 are designed in accordance with the principles of the present invention.

Figure 1:
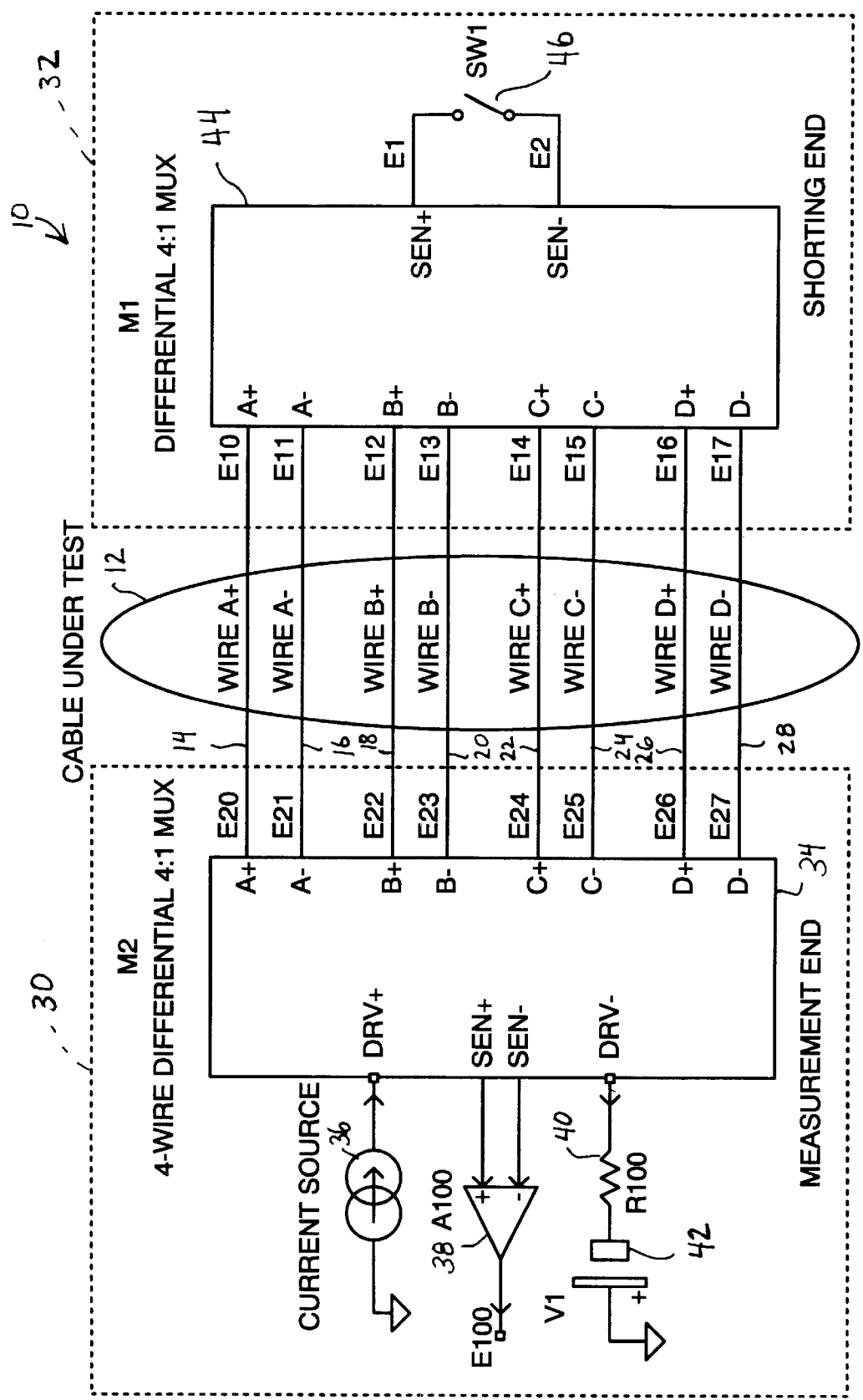
FIG. 1 is a circuit schematic diagram of the circuit components included within a prior art cable conductor pair resistance test circuit.
Figure 2:
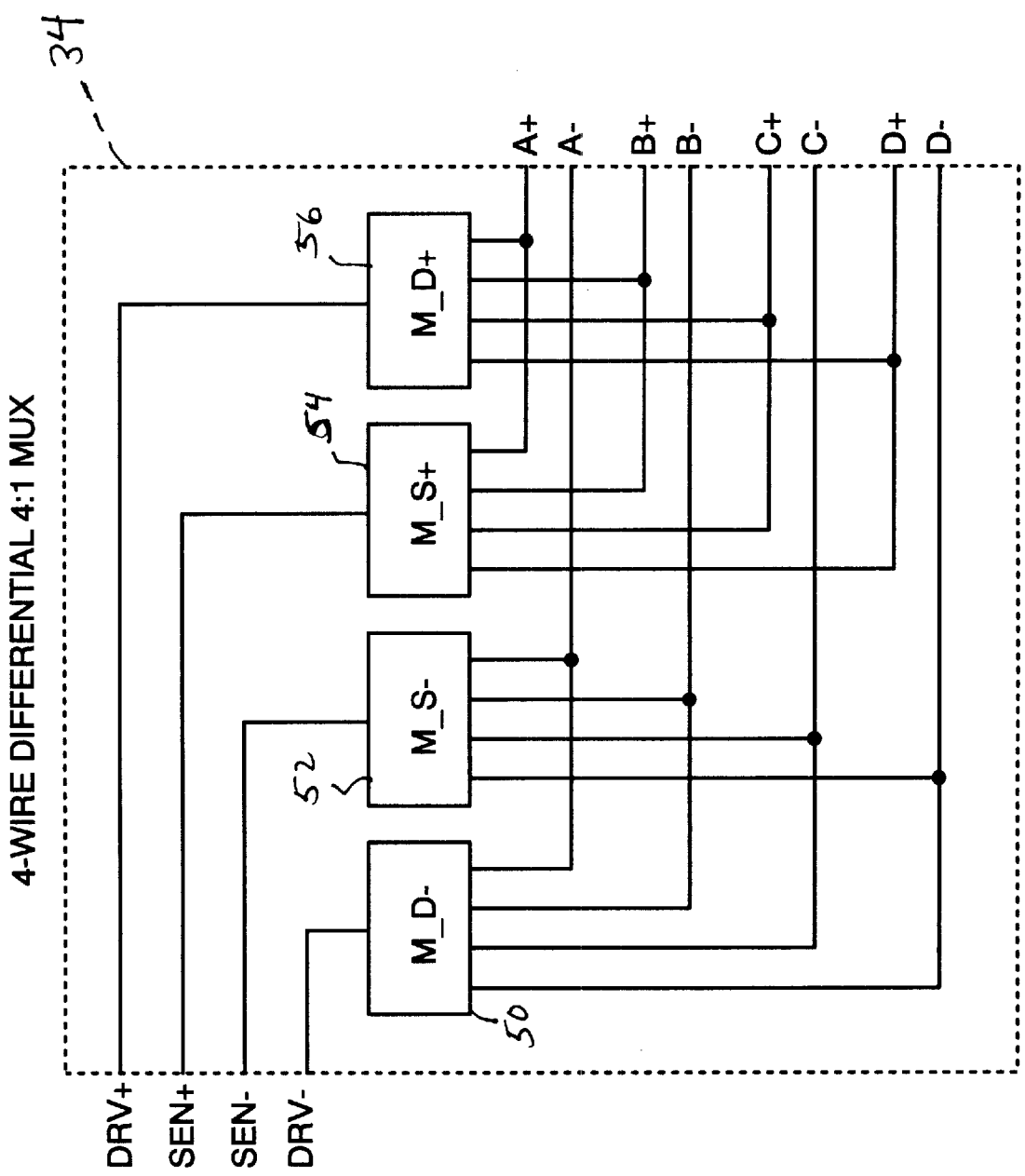
FIG. 2 is a circuit schematic diagram of a preferred form of circuit components used to implement an electronic circuit component shown in FIG. 1.

In the illustrated form, measurement circuit components 30 include a multiplexer circuit 34 shown in the form of a four-wire differential four-to-one multiplexer, as was described with reference to FIGS. 1 and 2. As was further described, measurement circuit components 30 also include a current source 36, a differential voltage sensing amplifier 38, and the combination of a series-coupled resistor 40 and voltage source 42, all of which are electrically coupled to multiplexer circuit 34. The electrical conductors included within cable 12 are electrically coupled to terminals of multiplexer circuit 34 in the manner described with reference to FIG. 1.

Shorting circuit components 132 include a multiplexer circuit 150 illustrated as a four-wire differential four-to-one multiplexer. Multiplexer circuit 150 includes a plurality of terminals such as pins incorporated in an integrated circuit packaging. Among the terminals of multiplexer circuit 150, for present purposes, select ones of those terminals are designated A+, A−, B+, B−, C+, C−, D+, D−, DRV+, DRV−, SEN+, and SEN−.

Shorting circuit components 132 also include a differential voltage amplifier circuit 152, a current output differential amplifier circuit 154 and a counterpart current output differential amplifier circuit 156. As shown, the noninverting input terminal of differential voltage amplifier circuit 152 is electrically coupled to the SEN+ terminal of multiplexer circuit 150. The inverting input terminal of amplifier circuit 152 is electrically coupled to the SEN− terminal of multiplexer circuit 150. Its output terminal is electrically coupled to the inverting input terminal of current output differential amplifier circuit 154 and to the noninverting input terminal of current output differential amplifier circuit 156 to form a node designated as E5 in FIG. 3.

As further shown, the noninverting input terminal of current output differential amplifier circuit 154 is electrically coupled to a voltage reference, and its output terminal is electrically coupled to the DRV+ terminal of multiplexer circuit 150. Regarding current output differential amplifier circuit 156, its inverting input terminal is electrically coupled to a voltage reference, while its output terminal is electrically coupled to the DRV− terminal of multiplexer circuit 150.

Differential voltage amplifier circuit 152 has a very high input impedance such that at its inputs do not load the circuit being sensed at the respective measurement ends of conductors 14 and 16 (i.e., nodes E10 and E11). Because of this high input impedance, and as will be appreciated by those skilled in the art, the on-resistance for multiplexer circuit 150 present between terminals A+ and SEN+ of the multiplexer circuit does not produce an appreciable voltage difference between those terminals. Similarly, the on-resistance of multiplexer circuit 150 between its terminals A− and SEN− does not produce an appreciable voltage difference between those terminals.

Differential voltage amplifier circuit 152 has a very high voltage gain such that the voltage present at its output terminal is a function of the differential voltage present between the shorting ends of electrical conductors 14, 16 (i.e., the differential voltage between nodes E10 and E11). The voltage present at the output terminal of differential voltage amplifier circuit 152 is equal to the differential voltage between its input terminals multiplied by a constant, $K_1$, which is a generally large positive number, typically on the order or $10^5$ (100,000) or greater. In effect, $V_{E5}=K_1(V_{E1}-V_{E2})$, where $V_{E5}$ is the voltage at the output terminal of amplifier circuit 152, $K_1$ is the aforementioned constant, $V_{E1}$ is the voltage at the noninverting input terminal of amplifier circuit 152, and $V_{E2}$ is the voltage at the inverting input terminal of amplifier circuit 152.

The current output differential amplifier circuit 154 is a current source or sink having a very high output impedance. Within the nominal operating range of current output differential amplifier circuit 154, changes in the voltage present at its output terminal do not affect the current sunk into that terminal or sourced out of that terminal. In other words, the output current of amplifier circuit 154 is strictly a function of the voltage applied to its inverting input terminal. Amplifier circuit 154 has a fixed finite gain such that its output current is equal to the voltage present at its inverting input terminal multiplied by the negative of a constant, $K_2$. Constant $K_2$ is generally a fixed finite positive value, such as 0.02 mho. In effect, $I_2=(-K_2)(V_{E5})$, where $I_2$ is the current sourced out of amplifier circuit 154, $K_2$ is the aforementioned constant, and $V_{E5}$ is the voltage at the inverting input terminal of amplifier circuit 154. This formula assumes that a ground reference voltage is electrically coupled to the noninverting input terminal of amplifier circuit 154.

Current output differential amplifier circuit 156 is identical in principle to amplifier circuit 154. It also is a current source or sink with very high output impedance. Within its nominal operating range, changes in the voltage present at its output terminal do not affect the current sunk into that terminal or sourced from that terminal. In other words, its output current is only a function of the voltage applied to its noninverting input terminal. Amplifier circuit 156 has a fixed finite gain such that its output current is equal to the voltage present on its noninverting input terminal multiplied by a constant, $K_3$. In this case, the constant $K_3$ is a fixed finite positive value such as 0.02 mho. Amplifier circuits 154 and 156 having matching characteristics such that the value of this constant $K_3$ is defined to be exactly the same as the value of the constant $K_2$ used to determine the output current of amplifier circuit 154. For this amplifier circuit 156, $I_3=(K_3)(V_{E5})$, where 13 is the current sourced out of amplifier circuit 156, $K_3$ is the aforementioned constant, and $V_{E5}$ is the voltage at the noninverting input terminal of amplifier circuit 156. As stated above, $K_3=K_2$. Further, this formula assumes that a ground reference voltage is electrically coupled to the inverting input terminal of amplifier circuit 156.

Because the output impedance of amplifier circuit 154 is very high, the addition of the on-resistance of multiplexer circuit 150 in series with the output of the amplifier circuit does not affect its output current appreciably. For all practical purposes, this output current is controlled solely by the voltage present at its inverting input terminal.

In similar fashion, because the output impedance of amplifier circuit 156 is very high, the addition of the on-resistance of multiplexer circuit 150 in series with the output of that amplifier circuit does not affect its output current appreciably. As indicated above, for all practical purposes, the output current of amplifier circuit 156 is controlled solely by the voltage present at its noninverting input terminal.

As will be appreciated by those skilled in the art, the operation of amplifier circuits 152, 154, 156 is such that amplifier circuit 152 functions as a voltage error amplifier. If a voltage differential exists between the shorting ends of the associated conductors of the pair selected for testing, then an error voltage signal is generated and applied to the inverting input terminal of amplifier circuit 154 and likewise to the noninverting input terminal of amplifier circuit 156. In turn, an equalizing current is produced to equalize the voltage differential between the shorting ends of those conductors. This operation is described in further detail in the following example.

For purposes of this example, one of the pairs of associated electrical conductors has been selected to be tested by having its total resistance determined by test circuit 100. It will be appreciated by those skilled in the art that any pair of conductors can be selected for test. Assuming that the pair corresponding to conductors 14, 16 is selected for test, multiplexer circuit 34 at the measurement end electrically couples its terminals DRV+ and SEN+ to its terminal A+, and further electrically couples its terminals DRV− and SEN− to its terminal A−. The four multiplexer circuits 50, 52, 54, 56 represented in FIG. 2 having a ganged action accomplish this electrical coupling of the terminals in multiplexer circuit 34.

Current source 36 is thereby electrically coupled to electrical conductor 14 at its measurement end, and the combination of resistor 40 and voltage source 42 is electrically coupled to electrical conductor 16 at its measurement end. Current source 36 drives a fixed reference current through electrical conductor 14. While different amounts of electrical current might suitable, it is preferred that a fixed amount such as ten milliamperes is used in this example.

In the absence of current flow into amplifier circuit 154, the voltage present at the shorting end (node $E_{10}$) of electrical conductor 14 will steadily increase. As a result, a voltage differential will develop between the shorting ends of electrical conductors 14 and 16 (between nodes $E_{10}$ and $E_{11}$), causing amplifier circuit 152 to generate a voltage error detection signal and apply that signal to amplifier circuits 154 and 156. In turn, amplifier circuits 154 and 156 produce an equalizing current to equalize the voltage differential between the shorting ends of electrical conductors 14 and 16. Once the voltage balance is restored, and while the voltage remains balanced, the output sink or source current for amplifier circuit 154 is equal to the current delivered by current source 36. Similarly, the output sink or source current for amplifier circuit 156 has an identical magnitude, but opposite polarity, of the output current for amplifier circuit 154. In that regard, the output current for amplifier circuit 156 is equal to the current delivered by current source 36, thereby completing the circuit from the shorting end of electrical conductor 14 to the shorting end of electrical conductor 16 (i.e., from node $E_{10}$ to node $E_{11}$). It will be appreciated that the current delivered by current source 36 can be a constant DC current, a pulsed DC current, or an AC current.

The voltage balancing action of differential voltage amplifier circuit 152 emulates a short circuit between the shorting end of electrical conductor 14 and the shorting end of electrical conductor 16. The high output impedances of current output differential amplifier circuits 154, 156, the high input impedance of differential voltage amplifier circuit 152, and the equal gains of amplifier circuits 154, 156 effectively isolate the shorting circuit components 132 from the remaining circuitry included within test circuit 100. That is, there is no net current flow from the measurement end of cable 12 to the shorting end of the cable. In particular, conductors 14 and 16 have balanced currents.

As will be appreciated by those skilled in the art, resistor 40 and voltage source 42 provide a return path for the measurement current delivered by current source 36. Voltage source 42 provides a bias voltage to allow multiplexer circuits 34, 152 to operate within their nominal operating ranges.

The test circuit 100 shown in FIG. 3 has the principal advantage of inherently cancelling the on-resistance of the semiconductor integrated circuit multiplexer used on the shorting end thereof. The ability to use a semiconductor integrated circuit multiplexer allows for smaller and less expensive components and further provides better functionality such as reduced power requirements and more reliable operation, particularly when compared to the prior art, which often required use of electromechanical relays for accurate testing. These benefits provide significant advantages in any instrumentation application requiring a precision short that is to be applied to various pairs of conductors or contacts. These benefits are particularly noteworthy in the case of portable, low power applications such as LAN cable tester applications.

It is appreciated that certain, non-ideal characteristics will exist in practice, such as leakage currents through multiplexer circuits, a finite input impedance of the differential voltage amplifier circuit, a finite impedance for one or both of the current output differential amplifier circuits, and/or imperfectly balanced gains for those circuits. While these non-ideal characteristics will result in a non-zero shorting impedance at the shorting ends of the conductors of the test pair and/or a non-zero net current, those skilled in the art will appreciate that any error attributable thereto will be significantly less than errors attributable to the on-resistance of the multiplexer circuits used in the prior art.

Figure 4:
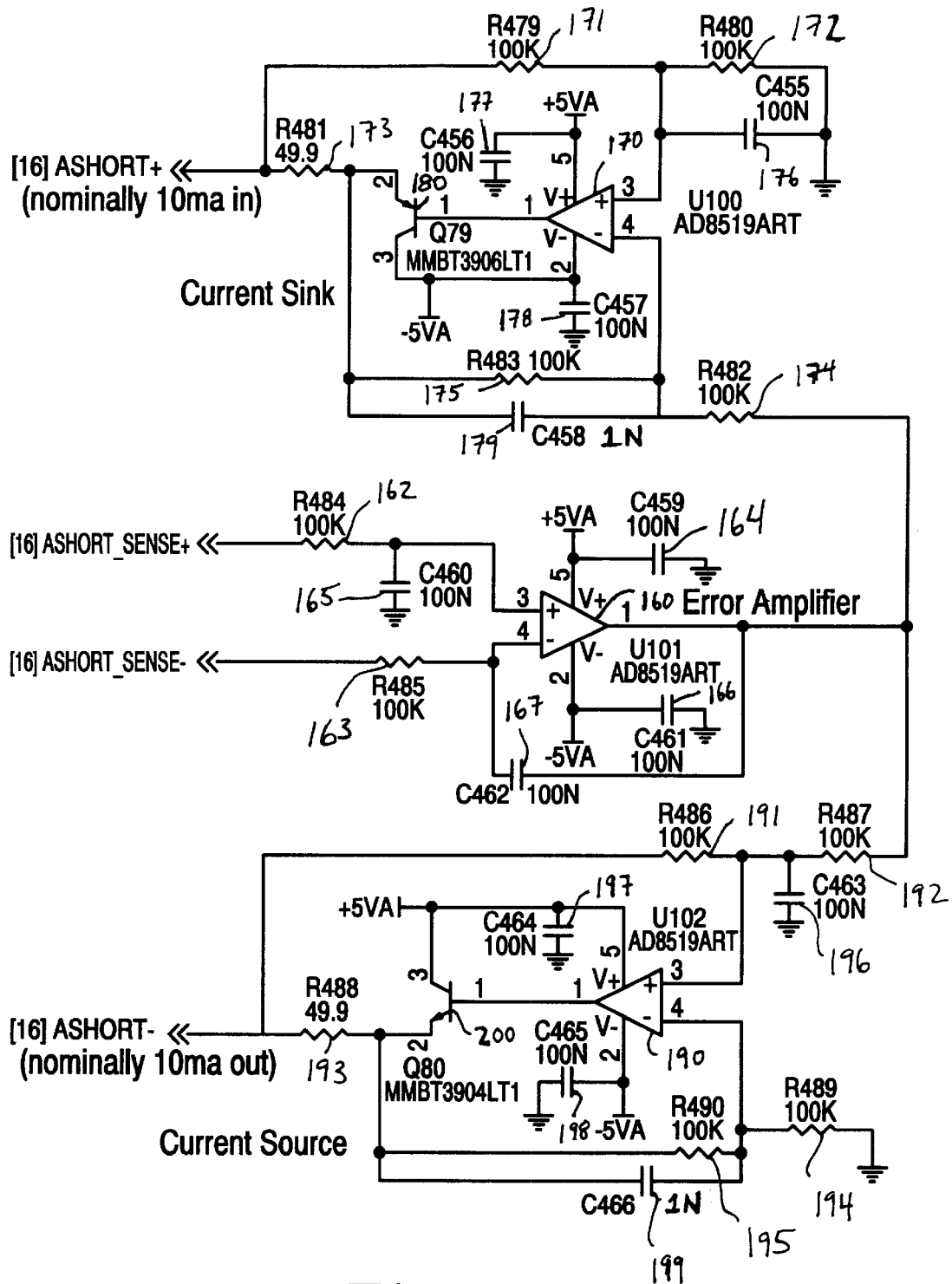
FIG. 4 is a circuit schematic diagram representing a preferred form of certain circuit components shown in FIG. 3.

FIG. 4 illustrates a preferred implementation of amplifier circuits 152, 154, 156 shown in FIG. 3. This implementation can be used in a LAN cable tester.

Several circuit components shown in FIG. 4 correspond to differential voltage amplifier circuit 152 of FIG. 3. Those circuit components include an operational amplifier 160 having a high input impedance, resistors 162–163, and capacitors 164–167. Those circuit components are arranged as shown in FIG. 4.

On the basis of this arrangement, those skilled in the art will appreciate that, in operation, resistors 162 and 163, and capacitors 165 and 167 produce an integrating frequency response for amplifier circuit 152. This integrating frequency response will reduce the susceptibility of the test circuit to noise and other undesired signal characteristics, such as hum, picked up on the cable under test. As shown, capacitors 164, 166 electrically couple any undesired high frequency component from the power supplies of operational amplifier 160 to the reference voltage.

Several other circuit components shown in FIG. 4 correspond to current output differential amplifier circuit 154 of FIG. 3. Those other circuit components include an operational amplifier 170, resistors 171–175, capacitors 176–179, and a bipolar junction transistor 180 preferably having a PNP-type configuration. The circuit components are arranged as shown in FIG. 4.

As will be appreciated by those skilled in the art, these circuit components comprise a standard operational amplifier-type implementation of a bilateral current source or sink circuit. Because it is known that the net direct current (DC) current into this arrangement of circuit components at terminal ASHORT+ is positive in this LAN cable tester application, a single transistor 180 can be used to provide the relatively high drive levels on the order of ten milliamperes from the low power operational amplifier 170.

Capacitors 176 and 179 have been added to the circuit to generate a low-pass type frequency response of the voltage to current action and to provide a capacitance alternating current (AC) output impedance. As a result, the influence of noise and hum present on the cable under test is reduced. While this particular arrangement of circuit components corresponding to amplifier circuit 154 is preferred, it will be appreciated by those skilled in the art that any suitable implementation of fixed gain precision voltage to current source circuit arrangements can be used.

Several other circuit components shown in FIG. 4 correspond to current output differential amplifier circuit 156 of FIG. 3. As will be apparent, these circuit components resemble those used for amplifier circuit 154. These other circuit components include an operational amplifier 190, resistors 191–195, capacitors 196–199, and a bipolar junction transistor 200 preferably having a PNP-type configuration. The circuit components are arranged as shown in FIG. 4.

As will be appreciated by those skilled in the art, these circuit components also comprise a standard operational amplifier-type implementation of a bilateral current source or sink circuit. Because it is known that the net DC current into this arrangement of circuit components at terminal ASHORT− is negative in this LAN cable tester application, a single transistor 200 can be used to provide the relatively high drive levels on the order of ten milliamperes from the low power operational amplifier 190.

Capacitors 196 and 199 have been added to the circuit to generate a low-pass type frequency response of the voltage to current action and to provide a capacitance AC output impedance. As a result, the influence of noise and hum present on the cable under test is reduced. While the particular arrangement of circuit components corresponding to amplifier circuit 156 is preferred, it will be appreciated by those skilled in the art that any suitable implementation of fixed gain precision voltage to current source circuit arrangements can be used.

The designations used in conjunction with the circuit components illustrated in FIG. 4 will be understood by those skilled in the art. Furthermore, it will be appreciated that values indicated for those components will be in accordance with their standard units of measurement. For example, resistor 162 shown in FIG. 4 will preferably have a resistance of one hundred kiloohms. Similarly, capacitor 164 shown in FIG. 4 will preferably have a capacitance of one hundred nanofarads. It will be appreciated by those skilled in the art that the specific set of component values shown is an illustrative example and that other scaled values will give the same results.

Figure 5:
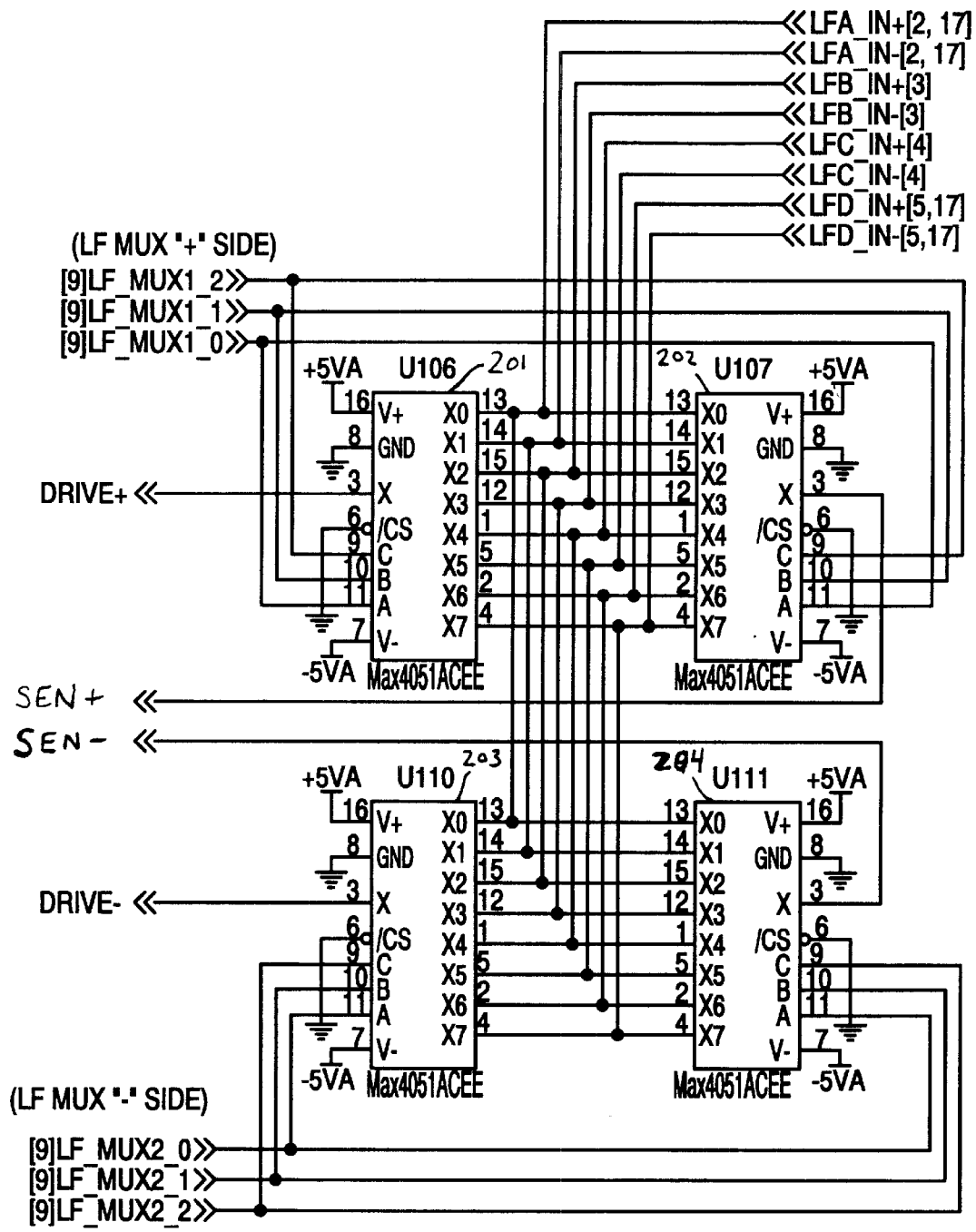
FIG. 5 is a circuit schematic diagram representing a preferred form of circuit components used to implement an electronic circuit component shown in FIG. 3.

FIG. 5 illustrates a preferred implementation of four-wire differential four-to-one multiplexer circuit 150 shown in FIG. 3. Four identical eight-to-one integrated circuit multiplexer circuits 201–204 are shown in FIG. 5. Each of multiplexer circuits 201–204 includes input terminals X0–X7; a chip select terminal /CS; control terminals A, B, C; ground and power supply terminals GND, V+, V−; and, an output terminal X.

As shown, input terminals X0–X7 for each multiplexer circuit 201–204 are electrically coupled to the signal conductors of the cable under test. The chip select terminal for each multiplexer circuit 201–204 is electrically coupled to a voltage reference such that each of the multiplexer circuits is enabled.

The control input terminals for multiplexer circuits 201 and 202 are electrically coupled to a first set of control signals, while the control terminals for multiplexer circuits 203 and 204 are electrically coupled to a second set of control signals. These two sets of control signals are differentiated such that when multiplexer circuits 201 and 202 are electrically coupled to one of the associated electrical conductors in a pair to be tested, multiplexer circuits 203 and 204 are electrically coupled to the other associated electrical conductor of the pair.

The output terminal of multiplexer circuit 201 (DRIVE+) is electrically coupled to the output terminal of current output differential amplifier circuit 154 shown in FIG. 3 (i.e., terminal ASHORT+ shown in FIG. 4). The output terminal of multiplexer circuit 202 (SEN+) is electrically coupled to the noninverting input terminal of differential voltage amplifier circuit 152 shown in FIG. 3 (i.e., terminal ASHORT_SENSE+ shown in FIG. 4). The output terminal (DRIVE−) of multiplexer circuit 203 is electrically coupled to the output terminal of current output differential amplifier circuit 156 shown in FIG. 3 (i.e., terminal ASHORT− shown in FIG. 4). And, the output terminal of multiplexer circuit 204 (SEN−) is electrically coupled to the inverting input terminal of differential voltage amplifier circuit 152 shown in FIG. 3 (i.e., terminal ASHORT_SENSE− shown in FIG. 4). While not shown, it will be appreciated by those skilled in the art that secondary multiplexer switching will preferably be used to electrically couple the outputs of multiplexer circuits 201–204 shown in FIG. 5 to the amplifier circuits 152, 154, 156, as described above. It will also be appreciated that this secondary switching permits the outputs of multiplexer circuits 201–204 to be used for other measurements that can be made during testing.

While this invention has been described with reference to certain illustrative forms, it will be understood that this description shall not be construed in a limiting sense. Rather, various changes and modifications can be made to the illustrative embodiments without departing from the true spirit and scope of the invention, as defined by the following claims. Furthermore, it will be appreciated that any such changes and modifications will be recognized by those skilled in the art as an equivalent to one or more elements of the following claims, and shall be covered by such claims to the fullest extent permitted by law.

What is claimed is:

1. A circuit for providing a selectable short between a pair of electrical nodes selected from a plurality of pairs of electrical nodes, comprising:

a) a multiplexer circuit having a first terminal electrically coupled to a first node of a first pair of said nodes, a second terminal electrically coupled to a second node of said first pair of said nodes, a third terminal electrically coupled to a first node of a second pair of said nodes, a fourth terminal electrically coupled to a second node of said second pair of said nodes, a fifth terminal, a sixth terminal, a seventh terminal, and an eighth terminal;

b) a differential voltage amplifier circuit having a first input terminal electrically coupled to said fifth terminal of said multiplexer circuit, a second input terminal electrically coupled to said sixth terminal of said multiplexer circuit, and an output terminal;

c) a first current output differential amplifier circuit having a first input terminal electrically coupled to said output terminal of said differential voltage amplifier circuit, a second input terminal held at a predetermined voltage level, and an output terminal electrically coupled to said seventh terminal of said multiplexer circuit; and d) a second current output differential amplifier circuit having a first input terminal electrically coupled to said output terminal of said differential voltage amplifier circuit, a second input terminal held at a predetermined voltage level, and an output terminal electrically coupled to said eighth terminal of said multiplexer circuit;

e) wherein, in a first condition, said multiplexer circuit electrically couples its said first terminal to its said fifth terminal and to its said seventh terminal, and further electrically couples its said second terminal to its said sixth terminal and to its said eighth terminal, and wherein, in a second condition, said multiplexer circuit electrically couples its said third terminal to its said fifth terminal and to its said seventh terminal, and further electrically couples its said fourth terminal to its said sixth terminal and to its said eighth terminal.

2. The circuit as defined by claim 1 wherein said multiplexer circuit comprises a four-wire differential multiplexer switching circuit.

3. The circuit as defined by claim 2 wherein said multiplexer circuit comprises first, second, third and fourth individual multiplexers, said first individual multiplexer being electrically coupled to said first input terminal of said differential voltage amplifier circuit, said second individual multiplexer being electrically coupled to said second input terminal of said differential voltage amplifier circuit, said third individual multiplexer being electrically coupled to said output terminal of said first current output differential amplifier circuit, and said fourth individual multiplexer being electrically coupled to said output terminal of said second current output differential amplifier circuit.

4. The circuit as defined by claim 1 wherein said multiplexer circuit comprises a relatively high impedance integrated circuit multiplexer circuit.

5. The circuit as defined by claim 1 wherein said first terminal of said multiplexer circuit is electrically coupled to an end of a first electrical conductor, said second terminal of said multiplexer circuit is electrically coupled to an end of a second electrical conductor, said third terminal of said multiplexer circuit is electrically coupled to an end of a third electrical conductor, and said fourth terminal of said multiplexer circuit is electrically coupled to an end of a fourth electrical conductor.

6. The circuit as defined by claim 1 wherein said differential voltage amplifier circuit has a high input impedance.

7. The circuit as defined by claim 1 wherein said differential voltage amplifier circuit has a large gain.

8. The circuit as defined by claim 1 wherein said first input terminal of said differential voltage amplifier circuit comprises a noninverting input terminal, and said second input terminal of said differential voltage amplifier circuit comprises an inverting input terminal.

9. The circuit as defined by claim 1 wherein said differential voltage amplifier circuit comprises circuit components causing it to have an integrating frequency response.

10. The circuit as defined by claim 1 wherein said first current output differential amplifier circuit has a high output impedance.

11. The circuit as defined by claim 10 wherein said second current output differential amplifier circuit has a high output impedance.

12. The circuit as defined by claim 1 wherein said first input terminal of said first current output differential amplifier circuit comprises an inverting input terminal, and said second input terminal of said first current output differential amplifier circuit comprises a noninverting input terminal.

13. The circuit as defined by claim 1 wherein said second input terminal of said first current output differential amplifier circuit is held at a ground reference voltage level.

14. The circuit as defined by claim 13 wherein said second input terminal of said second current output differential amplifier circuit is held at a ground reference voltage level.

15. The circuit as defined by claim 1 wherein said first current output differential amplifier circuit is balanced with said second current output differential amplifier circuit.

16. The circuit as defined by claim 1 wherein said first current output differential amplifier circuit comprises a controlled current source or sink circuit having a low-pass type frequency response.

17. The circuit as defined by claim 16 wherein said second current output differential amplifier circuit comprises a controlled current source or sink circuit having a low-pass type frequency response.

18. The circuit as defined by claim 1 wherein said differential voltage amplifier circuit monitors and detects a voltage differential at said first pair of said nodes when said multiplexer circuit is in said first condition, and wherein said differential voltage amplifier circuit monitors and detects a voltage differential at said second pair of nodes when said multiplexer circuit is in said second condition.

19. The circuit as defined by claim 18 wherein said differential voltage amplifier circuit generates a voltage error detection signal in response to a voltage differential existing between its first input terminal and its second input terminal.

20. The circuit as defined by claim 19 wherein said voltage error detection signal is applied to said first input terminal of said first current output differential amplifier circuit and said first input terminal of said second current output differential amplifier circuit to cause said first current output differential amplifier circuit to be driven in a first phase and said second current output differential amplifier circuit to be driven in a second phase opposite said first phase, and in response thereto, said first and second current output differential amplifier circuits produce an equalizing current.

21. A test circuit for determining the total resistance of a selected pair of associated electrical conductors, comprising:

a) a first multiplexer circuit having a first terminal electrically coupled to a first end of a first electrical conductor of a first pair, a second terminal electrically coupled to a first end of a second electrical conductor of said first pair, a third terminal electrically coupled to a first end of a first electrical conductor of a second pair, a fourth terminal electrically coupled to a first end of a second electrical conductor of said second pair, a fifth terminal, a sixth terminal, a seventh terminal, and an eighth terminal held at a predetermined voltage level;

b) a current source electrically coupled to said fifth terminal of said first multiplexer circuit;

c) a differential voltage sensing amplifier having a first input terminal electrically coupled to said sixth terminal of said first multiplexer circuit and having a second input terminal electrically coupled to said seventh terminal of said first multiplexer circuit;

d) a second multiplexer circuit having a first terminal electrically coupled to a second end of said first electrical conductor of said first pair, a second terminal electrically coupled to a second end of said second electrical conductor of said first pair, a third terminal electrically coupled to a second end of said first electrical conductor of said second pair, a fourth terminal electrically coupled to a second end of said second electrical conductor of said second pair, a fifth terminal, a sixth terminal, a seventh terminal, and an eighth terminal;

e) a differential voltage amplifier circuit having a first input terminal electrically coupled to said fifth terminal of said second multiplexer circuit, a second input terminal electrically coupled to said sixth terminal of said second multiplexer circuit, and an output terminal;

f) a first current output differential amplifier circuit having a first input terminal electrically coupled to said output terminal of said differential voltage amplifier circuit, a second input terminal held at a predetermined voltage level, and an output terminal electrically coupled to said seventh terminal of said second multiplexer circuit; and g) a second current output differential amplifier circuit having a first input terminal electrically coupled to said output terminal of said differential voltage amplifier circuit, a second input terminal held at a predetermined voltage level, and an output terminal electrically coupled to said eighth terminal of said second multiplexer circuit;

h) wherein, in a first condition, said first multiplexer circuit electrically couples its said first terminal to its said fifth terminal and to its said sixth terminal, and further electrically couples its said second terminal to its said seventh terminal and to its said eighth terminal, and wherein, in a second condition, said first multiplexer circuit electrically couples its said third terminal to its said fifth terminal and to its said sixth terminal, and further electrically couples its said fourth terminal to its said seventh terminal and to its said eighth terminal; and i) wherein, in said first condition, said second multiplexer circuit electrically couples its said first terminal to its said fifth terminal and to its said seventh terminal, and further electrically couples its said second terminal to its said sixth terminal and to its said eighth terminal, and wherein, in said second condition, said second multiplexer circuit electrically couples its said third terminal to its said fifth terminal and to its said seventh terminal, and further electrically couples its said fourth terminal to its said sixth terminal and to its said eighth terminal.

22. The circuit as defined by claim 21 wherein said second multiplexer circuit comprises a four-wire differential multiplexer switching circuit.

23. The circuit as defined by claim 22 wherein said second multiplexer circuit comprises first, second, third and fourth individual multiplexers, said first individual multiplexer being electrically coupled to said first input terminal of said differential voltage amplifier circuit, said second individual multiplexer being electrically coupled to said second input terminal of said differential voltage amplifier circuit, said third individual multiplexer being electrically coupled to said output terminal of said first current output differential amplifier circuit, and said fourth individual multiplexer being electrically coupled to said output terminal of said second current output differential amplifier circuit.

24. The circuit as defined by claim 21 wherein said second multiplexer circuit comprises a relatively high impedance integrated circuit multiplexer circuit.

25. The circuit as defined by claim 21 wherein said differential voltage amplifier circuit has a high input impedance.

26. The circuit as defined by claim 21 wherein said differential voltage amplifier circuit has a large gain.

27. The circuit as defined by claim 21 wherein said first input terminal of said differential voltage amplifier circuit comprises a noninverting input terminal, and said second input terminal of said differential voltage amplifier circuit comprises an inverting input terminal.

28. The circuit as defined by claim 21 wherein said differential voltage amplifier circuit comprises circuit components causing it to have an integrating frequency response.

29. The circuit as defined by claim 21 wherein said first current output differential amplifier circuit has a high output impedance.

30. The circuit as defined by claim 29 wherein said second current output differential amplifier circuit has a high output impedance.

31. The circuit as defined by claim 21 wherein said first input terminal of said first current output differential amplifier circuit comprises an inverting input terminal, and said second input terminal of said first current output differential amplifier circuit comprises a noninverting input terminal.

32. The circuit as defined by claim 21 wherein said second input terminal of said first current output differential amplifier circuit is held at a ground reference voltage level.

33. The circuit as defined by claim 32 wherein said second input terminal of said second current output differential amplifier circuit is held at a ground reference voltage level.

34. The circuit as defined by claim 21 wherein said first current output differential amplifier circuit is balanced with said second current output differential amplifier circuit.

35. The circuit as defined by claim 21 wherein said first current output differential amplifier circuit comprises a controlled current source or sink circuit having a low-pass type frequency response.

36. The circuit as defined by claim 35 wherein said second current output differential amplifier circuit comprises a controlled current source or sink circuit having a low-pass type frequency response.

37. The circuit as defined by claim 21 wherein said differential voltage amplifier circuit monitors and detects a voltage differential at said second ends of said first pair of electrical conductors when said multiplexer circuits are in said first condition, and wherein said differential voltage amplifier circuit monitors and detects a voltage differential at said second ends of said second pair of electrical conductors when said multiplexer circuits are in said second condition.

38. The circuit as defined by claim 37 wherein said differential voltage amplifier circuit generates a voltage error detection signal in response to a voltage differential existing between its first input terminal and its second input terminal.

39. The circuit as defined by claim 38 wherein said voltage error detection signal is applied to said first input terminal of said first current output differential amplifier circuit and said first input terminal of said second current output differential amplifier circuit to cause said first input current output differential amplifier circuit to be driven in a first phase and said second current output differential amplifier circuit to be driven in a second phase opposite said first phase, and in response thereto, said first and second current output differential amplifier circuits produce an equalizing current.

40. The circuit as defined by claim 21 wherein said electrical conductors are part of a LAN cable.

41. The circuit as defined by claim 40 wherein a selected pair of said associated electrical conductors is a LAN cable tester pair.

42. A method of equalizing a voltage differential between a pair of nodes, comprising the steps of:

detecting a voltage differential between said pair of nodes;

generating a voltage error detection signal in response to detection of said voltage differential; and producing an equalizing current in response to said voltage error detection signal.

43. The method defined by claim 42 further comprising the step of selecting said pair of nodes from a plurality of pairs of nodes.

44. An apparatus for equalizing a voltage differential between a pair of nodes, comprising:

(a) a first circuit that detects a voltage differential between said pair of nodes and generates a voltage error detection signal in response thereto; and (b) a second circuit that produces an equalizing current in response to said voltage error detection signal.

45. The apparatus as defined in claim 44 further comprising a third circuit that selects said pair of nodes from a plurality of pairs of nodes.

* * * * *